United States Patent
Wojewoda

(10) Patent No.: US 9,641,178 B1
(45) Date of Patent: May 2, 2017

(54) FAST WI-FI SWITCH WITH DYNAMIC BIAS CIRCUIT

(71) Applicant: Tagore Technology, Inc., Arlington Heights, IL (US)

(72) Inventor: Carl E. Wojewoda, Lake Zurich, IL (US)

(73) Assignee: Tagore Technology, Inc., Arlington Heights, IL (US)

( * ) Notice: Subject to any disclaimer, the term of this patent is extended or adjusted under 35 U.S.C. 154(b) by 0 days.

(21) Appl. No.: 15/184,671

(22) Filed: Jun. 16, 2016

Related U.S. Application Data

(60) Provisional application No. 62/180,114, filed on Jun. 16, 2015, provisional application No. 62/180,122, filed on Jun. 16, 2015.

(51) Int. Cl.
| | |
|---|---|
| *H03L 5/00* | (2006.01) |
| *H03K 19/0185* | (2006.01) |
| *H03K 19/017* | (2006.01) |
| *H04L 12/931* | (2013.01) |
| *H04W 84/12* | (2009.01) |

(52) U.S. Cl.
CPC ......... *H03K 19/018507* (2013.01); *H03K 19/01728* (2013.01); *H04L 49/355* (2013.01); *H04W 84/12* (2013.01)

(58) Field of Classification Search
CPC .......... H03K 3/356; H03K 19/018521; H03K 19/00315; H03K 17/102; H03K 3/012
USPC .......... 327/108, 306, 333; 326/61–62, 80–81
See application file for complete search history.

(56) References Cited

U.S. PATENT DOCUMENTS

| | | | | |
|---|---|---|---|---|
| 8,324,760 | B2* | 12/2012 | Iijima | ............ H03K 17/693 307/109 |
| 8,598,946 | B2 | 12/2013 | Drost et al. | |
| 8,633,618 | B2* | 1/2014 | Iijima | ............ H03K 17/063 307/109 |
| 8,660,502 | B2 | 2/2014 | Wachi et al. | |
| 8,823,440 | B2 | 9/2014 | Chen et al. | |
| 9,294,050 | B2 | 3/2016 | Mostov et al. | |
| 9,312,820 | B2 | 4/2016 | Mostov et al. | |
| 9,425,749 | B2* | 8/2016 | Gulko | ............ H03F 1/0227 |
| 9,467,124 | B2* | 10/2016 | Crandall | ............ H03K 17/102 |
| 2016/0043710 | A1 | 2/2016 | Crandall et al. | |
| 2016/0094207 | A1 | 3/2016 | Crandall | |

* cited by examiner

*Primary Examiner* — Dinh T Le
(74) *Attorney, Agent, or Firm* — Donna Flores; Fleit Gibbons Gutman Bongini & Bianco P.L.

(57) ABSTRACT

An integrated radio frequency (RF) switch and method of outputting one RF signal from a plurality of RF signals is provided. The integrated RF switch comprises an input decoder, a plurality of level shifter/drivers, a negative voltage generator and a dynamic bias circuit. The input decoder determines which one of the plurality of RF signals to output. Each one of the plurality of level shifter/drivers controls output of one of the plurality of RF signals. The negative voltage generator creates a negative voltage to drive the plurality of level shifter/drivers. The dynamic bias circuit generates a bias current for the plurality of level shifter/drivers, detects a change of state from the input decoder, generates a pulse in response to detecting the change of state, and increases the bias current for the plurality of level shifter/drivers for a duration of the pulse to decrease a switching time between two RF signals.

20 Claims, 4 Drawing Sheets

300

FAST WI-FI SWITCH WITH DYNAMIC BIAS CIRCUIT

BACKGROUND

Field

This invention relates generally to active solid-state devices, and more specifically to a dynamic bias circuit for a fast Wi-Fi switch.

Related Art

Many fast switches for Wi-Fi access and similar applications drive the switches using locally generated biases and low impedance drivers. An example of such a switch 100 is shown in FIG. 1. Disadvantageously, a radio frequency (RF) signal at node RF100 is AC coupled to an output load (represented by R100) using capacitor C100 which increases a size of the switch 100. With the switch 100 of FIG. 1, a common node N100 is AC coupled via capacitor C100 to an output RF100, and is DC coupled via resistor R101 to $V_{dd}$. A negative bias voltage $V_{gs}$ of the switch 100 can, therefore, be driven from $-V_{dd}$ to 0V.

The switch 100 routes an RF signal from one of two channels RF101, RF102 to RF100 depending upon the bias voltage at the gates of the two FETs Q101, Q102. The bias voltages at the gates of Q101 and Q102 are set by the values of the control inputs P101, P102 of amplifiers digital logic gate U101, U102. An RF coupling capacitor C101, C102 is required for each channel RF101, RF102 and the common output RF100 to maintain this bias scheme. Because a swing of $V_{gs}$ is from only $-V_{dd}$ to ground, a power level of the output is limited.

An integrated solution of a fast switch 200 for Wi-Fi access and similar applications, which uses DC coupling at all RF ports is shown in FIG. 2. The switch 200 provides multiple RF ports (N), with each RF port controlled by a similar bias block. The integrated solution 200 shown in FIG. 2 includes an input decoder 202, a driver bias generator block 204, N level shifters/drivers 206a, 206b, . . . , 206N (referenced collectively and generally as level shifter/driver 206) and a negative voltage generator 208 (e.g., a charge pump). The integrated solution 200 shown in FIG. 2 allows DC coupling at all output ports P200a, P200b, . . . , P200N, i.e., coupling capacitors are not used. Control inputs P201 and P202 determine which RF signal RF201a, RF201b, . . . , RF201N to deliver to the RF Out node RF200. The input decoder 202 determines which of the level shifter/drivers 206a . . . 206N to activate to switch the corresponding RF signal RF201a . . . RF201N to be delivered to the RF Out node RF200 according to the values presented at the control inputs P201, P202. The voltage at the control inputs P201, P202 typically range from 0V for a "0" value to around 1.8V for a "1" value.

The input decoder 202 further informs the driver bias generator 204 to turn on to bias the level shifter/drivers 206 and activate the negative voltage generator 208. The negative voltage generator 208 provides the negative power supply voltage to each of the level/shifter drivers 206 to allow the level/shifter driver 206 to control a corresponding FET Q200a, . . . , Q200N (referenced collectively or generally as "FET Q200"). The positive power supply voltage of each level/shifter driver 206 is connected to ground. A high negative voltage from the negative voltage generator 208 allows a high peak voltage as would be found with high power signals. Thus, the level shifter/drivers 206 shifts the output voltage from 0V to 1.8V at the input, to the negative voltage generated by the negative voltage generator 208 to 0V. The voltage presented at the gate of each FET Q200 determines whether the FET is activated, thereby routing the RF signal from the corresponding RF node RF201a, . . . , RF201N to the RF Out node RF200. A negative voltage on the gate turns the FET Q200 off, while a zero voltage turns the FET Q200 on.

In addition, an integrated solution for a switch can generate the negative bias voltage to control a HEMT or other suitable transistor. The negative bias voltage in such integrated solutions is often generated by a charge pump. Charge pumps are generally high impedance due to an available area in an integrated solution. Because of the high impedance of a charge pump or of another source of the negative bias voltage switching times can be long. Using increased, but static, source and driver impedance would allow faster switching, but would increase average current and solution size.

BRIEF SUMMARY

In one embodiment, an integrated radio frequency (RF) switch for outputting one RF signal from a plurality of RF signals is disclosed. The integrated RF switch comprises an input decoder, a plurality of level shifter/drivers, a negative voltage generator and a dynamic bias circuit. The input decoder determines which one of the plurality of RF signals to output. Each one of the plurality of level shifter/drivers is coupled to the input decoder and controls output of one of the plurality of RF signals. The negative voltage generator is coupled to the input decoder and creates a negative voltage to drive the plurality of level shifter/drivers. The dynamic bias circuit is coupled to the input decoder and the negative voltage generator, generates a bias current for the plurality of level shifter/drivers, detects a change of state from the input decoder, generates a pulse in response to detecting the change of state, and increases the bias current for the plurality of level shifter/drivers for the duration of the pulse to decrease the switching time between two RF signals.

In another embodiment, a method of using an integrated radio frequency (RF) switch to output one RF signal from a plurality of RF signals is disclosed. The method comprises determining, by an input decoder, which one of the plurality of RF signals to output; generating a bias current for a plurality of level shifter/drivers coupled to the input decoder, each of the plurality of level shifter/drivers controlling output of one of the plurality of RF signals; creating a negative voltage to drive the plurality of level shifter/drivers; detecting a change of state from the input decoder; generating a pulse in response to detecting the change of state; and increasing the bias current for the plurality of level shifter/drivers for the duration of the pulse to decrease the switching time between two RF signals.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 3:
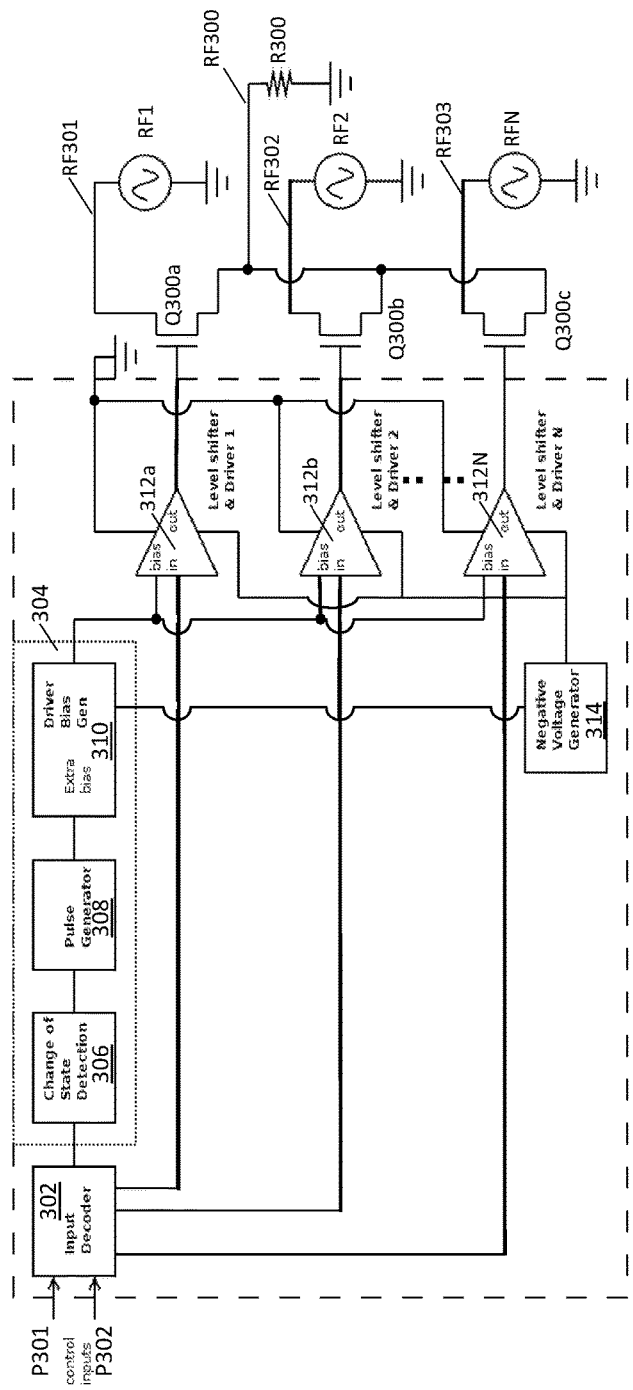
FIG. 3 is an example integrated solution of a fast switch for Wi-Fi access and similar applications, in accordance with one embodiment of the disclosure.

FIG. 3 is an example integrated solution of a fast switch 300 for Wi-Fi access and similar applications, in accordance with one embodiment of the present disclosure (hereinafter "integrated switch 300"). The integrated switch 300 is a fast RF switch that does not require RF coupling capacitors and can be used for Wi-Fi and other applications (e.g., up to 6 GHz). With the integrated switch 300, an RF signal is DC coupled, thereby saving space and cost. The integrated switch 300 expends low current drain during normal operation and has a low propagation delay for the RF signal during a change of state (i.e., when switching between RF inputs).

Figure 1:
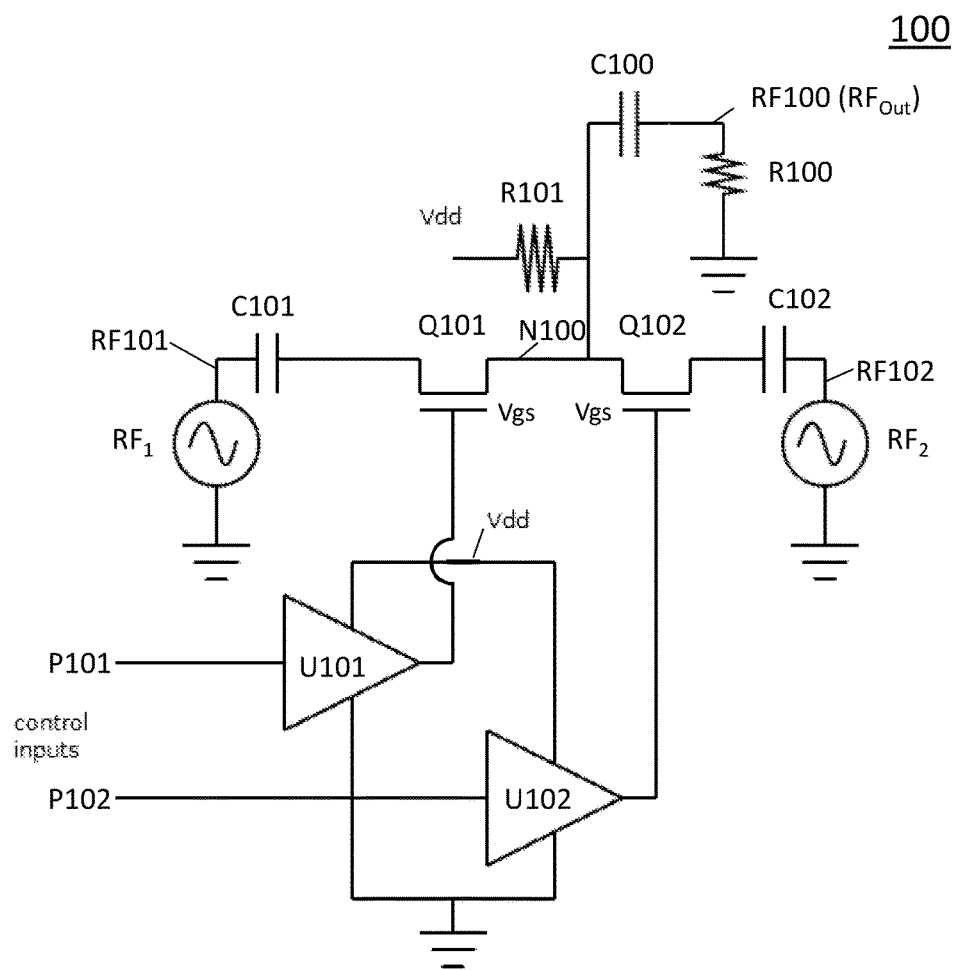
FIG. 1 is a simplified block diagram of a prior art fast switch, for Wi-Fi access and similar applications, which uses RF coupling capacitors.
Figure 2:
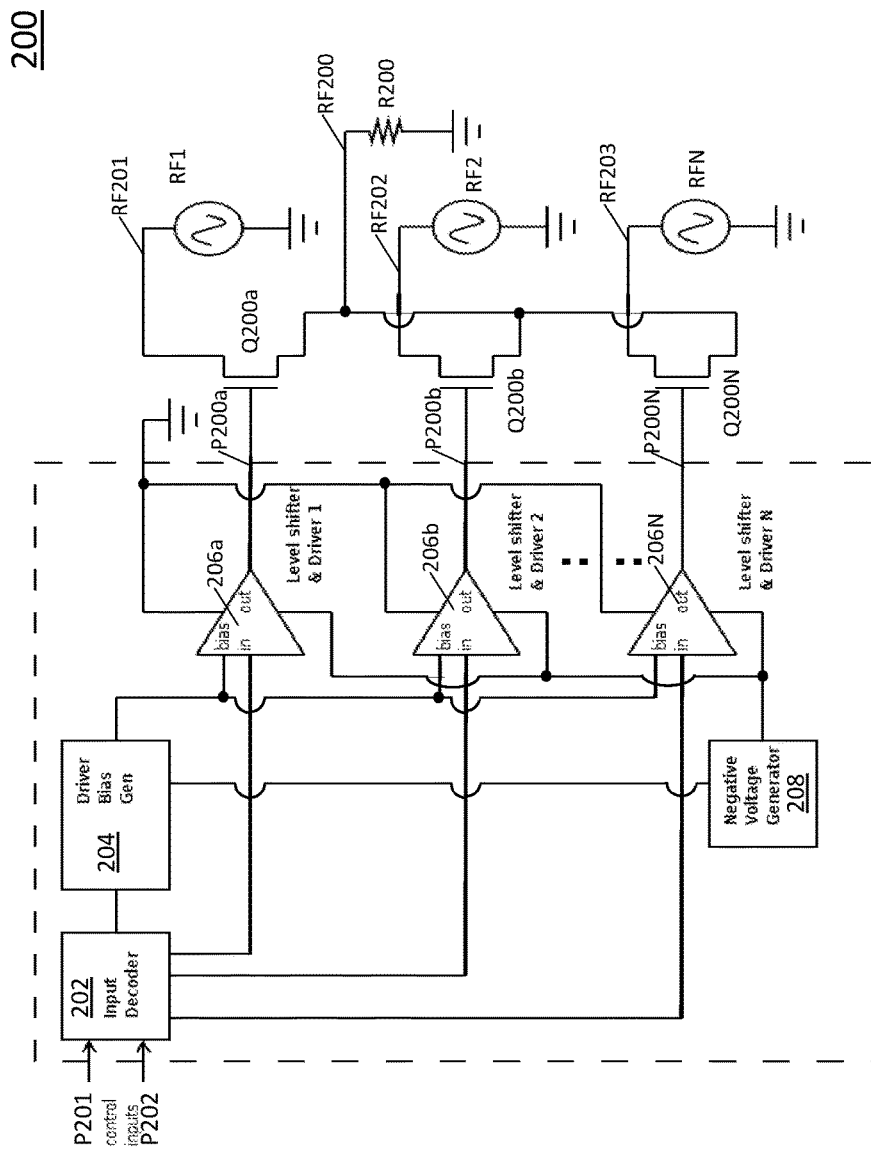
FIG. 2 is an integrated solution of a prior art fast switch, for Wi-Fi access and similar applications, which uses DC coupling at all ports.

The integrated switch 300, like the integrated solution 200 of FIG. 2, switches multiple RF signals RF301a, RF301b, . . . , RF301N to the RF Out node RF300. The RF signal RF301a, . . . , RF301N switched to the RF Out node RF300 is selected by the values of at the control inputs P301, P302 to the input decoder 302. Although there may be some exceptions, generally only one RF signal RF301 is routed to the RF Out node RF300 at any given time. In place of the driver bias generator block 204 of the integrated solution 200 shown in FIG. 2, the integrated switch 300 of FIG. 3 includes a dynamic bias circuit 304 in accordance with the disclosure. The dynamic bias circuit 304 includes a change of state detector 306, a pulse generator 308 and an improved driver bias generator 310. The dynamic bias circuit 302 provides a fast switching speed, maintains a low average current and has a small footprint. When a change of input states is detected by the change of state detector 306, a pulse is generated by the pulse generator 308. During the pulse width, the bias current is momentarily increased to the driver bias generator 310, which in turn, momentarily increases the current to the level shifters/drivers 312a, 312b, . . . , 312N. The majority of the propagation delay is through the level shifters/drivers 312. As the driver speed depends on bias current and, therefore, on average current, the increased current during the pulse width allows the switching to be completed much quicker than previously. In this way, the level shifters/drivers 312 can provide fast switching, but the average current remains low. For example, prior RF switching circuits typically have switching speeds around 1.5 μsec, but the switching speed of one example of the integrated switch 300 has been measured to be less than 300 nsec.

Figure 4:
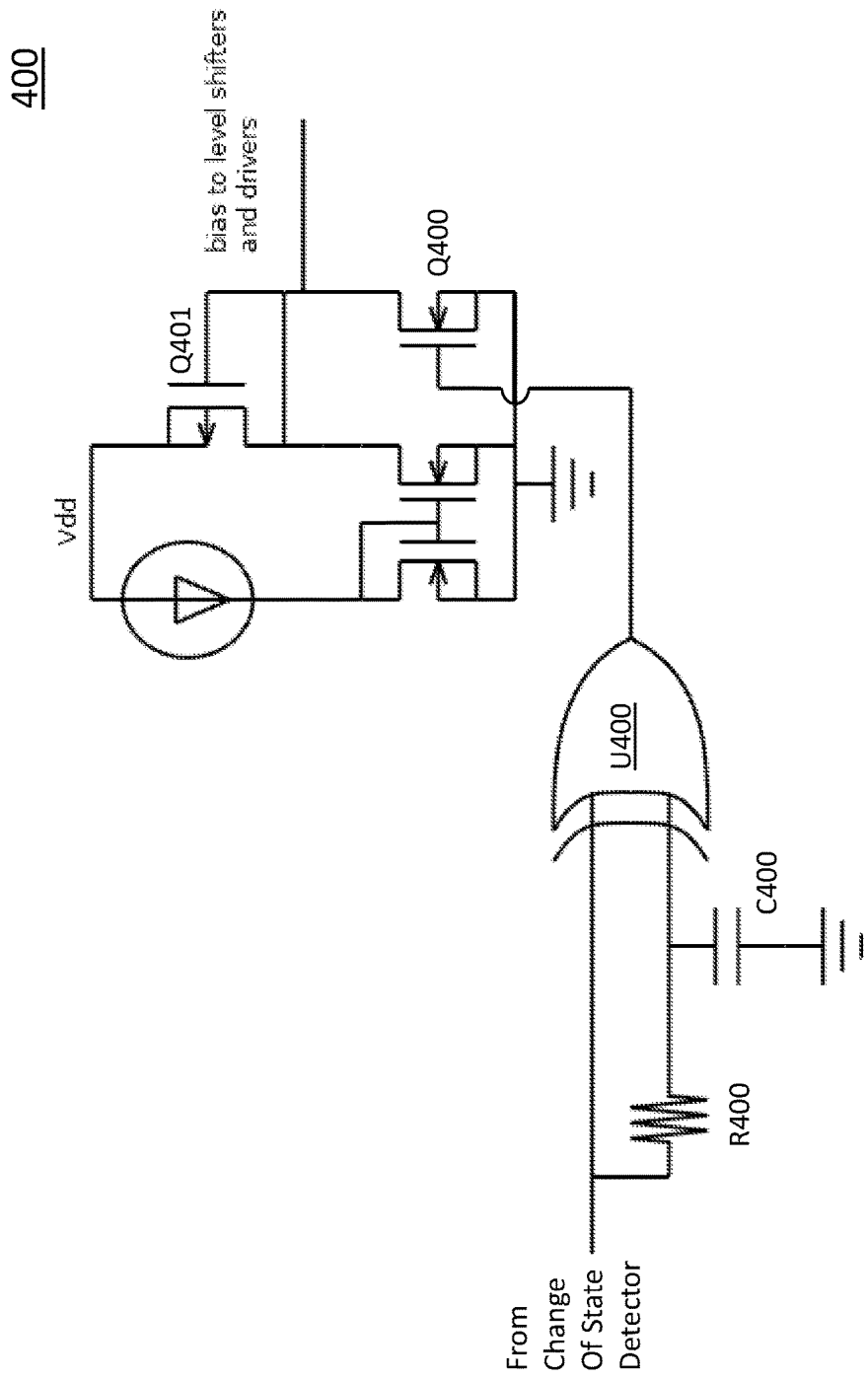
FIG. 4 is a schematic of a portion of the integrated solution of a fast switch of FIG. 3.

Turning now to FIG. 4, a schematic diagram of a portion 400 of an example of the dynamic bias circuit 304 of the integrated switch 300 is provided which includes the pulse generator 308 and the improved driver bias generator 310. FIG. 4 is a schematic of one embodiment of the dynamic bias circuit 304 in accordance with the disclosure. The improved driver bias generator 310 provides extra bias current when needed.

With the dynamic bias circuit 304 of FIG. 4, a change of input state and pulse generator is synthesized with an RC low pass filter (i.e., R400 and C400) and an XOR gate U400. When the input decoder 302 detects a change of state, the input signal to dynamic bias circuit 304 changes between a "1" and a "0" (e.g., between 1.8V and 0V). During the transition, for a small amount of time set by the delay through the RC filter, one input of XOR gate U400 is a "1" and the other input is a "0". Thus, for the duration of time set by the RC filter, the output of XOR gate U400 is a "high" (i.e., a "1"), thereby creating a pulse having a pulse width equal to the delay of the RC filter. Although the example described herein illustrates generating a pulse using a low pass RC filter in combination with an XOR gate, it should be noted this example is for illustrative purposes only. The pulse may be generated using other various techniques not described herein without deviating from the scope of the present disclosure.

When the output of XOR gate U400 is high, NMOS Q400 turns on for the duration of the pulse. Extra bias current is provided when the NMOS Q400 pulls on the gate of PMOS Q401 connected to the bias reference. It is generally advantageous, but not necessary, to choose an RC delay that is a little longer than the output switching time to ensure a complete transition before removing the extra current.

The integrated switch 300 may be used for a variety of wireless applications using a variety of wireless communication protocols, including short range communication protocols such as Wi-Fi (i.e., IEEE 802.11 standards), BLUETOOTH™, near field communications (NFC), and cellular protocols, including but not limited to Global System for Mobile Communications (GSM), Universal Mobile Telecommunications System (UMTS), Enhanced Data rates for GSM Evolution (EDGE), Long Term Evolution (LTE), Wi-MAX (i.e., IEEE 802.16 standards), etc.

It should be noted that some features of the present invention may be used in an embodiment thereof without use of other features of the present invention. As such, the foregoing description should be considered as merely illustrative of the principles, teachings, examples, and exemplary embodiments of the present invention, and not a limitation thereof.

It should be understood that these embodiments are only examples of the many advantageous uses of the innovative teachings herein. In general, statements made in the specification of the present application do not necessarily limit any of the various claimed inventions. Moreover, some statements may apply to some inventive features but not to others.

The circuit as described above is part of the design for an integrated circuit chip. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The methods as discussed above are used in the fabrication of integrated circuit chips. The resulting integrated circuit chips can be distributed by the fabricator in raw wafer form (that is, as a single wafer that has multiple unpackaged chips), as a bare chip, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products (such as, but not limited to, an information processing system) having a display, a keyboard, or other input device, and a central processor.

As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure. Further, the terms and phrases used herein are not intended to be limiting; but rather, to provide an understandable description of the invention.

The terms "a" or "an", as used herein, are defined as one as or more than one. The term plurality, as used herein, is defined as two as or more than two. Plural and singular terms are the same unless expressly stated otherwise. The term another, as used herein, is defined as at least a second or more. The terms including and/or having, as used herein, are defined as comprising (i.e., open language). The term coupled, as used herein, is defined as connected, although not necessarily directly, and not necessarily mechanically. The terms program, software application, and the like as used herein, are defined as a sequence of instructions designed for execution on a computer system. A program, computer program, or software application may include a subroutine, a function, a procedure, an object method, an object implementation, an executable application, an applet, a servlet, a source code, an object code, a shared library/dynamic load library and/or other sequence of instructions designed for execution on a computer system.

Although specific embodiments of the invention have been disclosed, those having ordinary skill in the art will understand that changes can be made to the specific embodiments without departing from the spirit and scope of the invention. The scope of the invention is not to be restricted, therefore, to the specific embodiments, and it is intended that the appended claims cover any and all such applications, modifications, and embodiments within the scope of the present invention.

What is claimed is:

1. An integrated radio frequency (RF) switch for outputting one RF signal from a plurality of RF signals, the integrated RF switch comprising:
   an input decoder that determines which one of the plurality of RF signals to output;
   a plurality of level shifter/drivers coupled to the input decoder, each of which controls output of one of the plurality of RF signals;
   a negative voltage generator coupled to the input decoder, that creates a negative voltage to drive the plurality of level shifter/drivers; and
   a dynamic bias circuit which:
      generates a bias current for the plurality of level shifter/drivers;
      detects a change of state from the input decoder;
      generates a pulse in response to detecting the change of state; and
      increases the bias current for the plurality of level shifter/drivers for a duration of the pulse to decrease a switching time between two RF signals.

2. The integrated RF switch of claim 1, wherein the dynamic bias circuit comprises a change of state detector, a pulse generator and a driver bias generator.

3. The integrated RF switch of claim 2, wherein the pulse generator comprises an XOR gate having two inputs, wherein a first input is connected to the change of state detector and a second input is connected to the change of state detector through a low pass RC filter.

4. The integrated RF switch of claim 3, wherein a width of the pulse is determined by a value of the low pass RC filter.

5. The integrated RF switch of claim 4, wherein an output of the XOR gate is high for a duration of time equal to a delay of the low pass RC filter, creating a pulse having a pulse width equal to the delay of the low pass RC filter.

6. The integrated RF switch of claim 5, wherein the driver bias generator comprises:
   an NMOS field effect transistor having a gate connected to the output of the XOR gate and a drain connected to a bias reference of each of the plurality of level shifter/drivers such that when the output of the XOR gate is high, additional bias current is supplied to each of the plurality of level shifter/drivers.

7. The integrated RF switch of claim 1, further comprising a plurality of field effect transistors (FET), wherein each of the plurality field effect transistors comprises:
   a gate connected to an output of one of the plurality of level shifter/drivers;
   a source that is DC coupled to one of a plurality of RF sources; and
   a drain that is DC coupled to an RF output, such that when a voltage at the gate is 0V, the FET is turned on and a signal from the RF source is routed through the FET to the RF output.

8. The integrated RF switch of claim 7, wherein when the voltage at the gate is negative, the FET is turned off and no signal is routed through the FET to the RF output.

9. The integrated RF switch of claim 1, wherein the switching time is less than 300 nsec.

10. The integrated RF switch of claim 1, wherein each of the plurality of RF signals has a frequency of up to 6 GHz.

11. The integrated RF switch of claim 1, wherein only one of the plurality of RF signals is output at a time.

12. The integrated RF switch of claim 1, wherein the integrated switch is used in Wi-Fi applications.

13. A method of using an integrated radio frequency (RF) switch to output one RF signal from a plurality of RF signals comprising:
   determining, by an input decoder, which one of the plurality of RF signals to output;
   generating a bias current for a plurality of level shifter/drivers coupled to the input decoder, each of the plurality of level shifter/drivers controlling output of one of the plurality of RF signals;
   creating a negative voltage to drive the plurality of level shifter/drivers;
   detecting a change of state from the input decoder;
   generating a pulse in response to detecting the change of state; and
   increasing the bias current for the plurality of level shifter/drivers for a duration of the pulse to decrease a switching time between two RF signals.

14. The method of claim 13, wherein the pulse is generated by an XOR gate having two inputs, wherein a first input is connected to a change of state detector and a second input is connected to the change of state detector through a low pass RC filter.

15. The method of claim 14, wherein a width of the pulse is determined by a value of the low pass RC filter.

16. The method of claim 15, wherein an output of the XOR gate is high for a duration of time equal to a delay of the low pass RC filter, creating a pulse having a pulse width equal to the delay of the low pass RC filter.

17. The method of claim 16, wherein increasing the bias current for the plurality of level shifter/drivers comprises:
connecting a gate of an NMOS field effect transistor to the output of the XOR gate and connecting a drain of the NMOS field effect transistor to a bias reference of each of the plurality of level shifter/drivers such that when the output of the XOR gate is high, additional bias current is supplied to each of the plurality of level shifter/drivers.

18. The method of claim 13, further comprising connecting a plurality of field effect transistors (FET), each FET having a gate, a source and a drain, such that:
the gate is connected to an output of one of the plurality of level shifter/drivers;
the source is DC coupled to one of a plurality of RF sources; and
the drain is DC coupled to an RF output, such that when a voltage at the gate is 0V, the FET is turned on and a signal from the RF source is routed through the FET to the RF output.

19. The method of claim 18, wherein when the voltage at the gate is negative, the FET is turned off and no signal is routed through the FET to the RF output.

20. The method of claim 13, further comprising using the integrated switch in Wi-Fi applications.

* * * * *